(12) United States Patent
Chen

(10) Patent No.: US 8,254,125 B2
(45) Date of Patent: Aug. 28, 2012

(54) MACHINE TOOL WITH A HEAT CONDUCTION STRUCTURE

(75) Inventor: Bach Pangho Chen, Claremont, CA (US)

(73) Assignee: X'Pole Precision Tools Inc., Taoyuan County (TW)

( * ) Notice: Subject to any disclaimer, the term of this patent is extended or adjusted under 35 U.S.C. 154(b) by 193 days.

(21) Appl. No.: 12/890,930

(22) Filed: Sep. 27, 2010

(65) Prior Publication Data

US 2012/0073784 A1 Mar. 29, 2012

(51) Int. Cl.
*H05K 7/20* (2006.01)
*E21B 3/00* (2006.01)
*B24B 3/00* (2006.01)

(52) U.S. Cl. ........ 361/704; 173/217; 361/707; 361/715; 361/719; 451/488

(58) Field of Classification Search ........................ None
See application file for complete search history.

(56) References Cited

U.S. PATENT DOCUMENTS

| | | | |
|---|---|---|---|
| 5,619,085 A * | 4/1997 | Shramo | 310/184 |
| 6,789,630 B2 | 9/2004 | Quirijnen et al. | |
| 6,920,047 B2 * | 7/2005 | Privett et al. | 361/704 |
| 7,166,939 B2 | 1/2007 | Voigt et al. | |
| 7,359,628 B2 * | 4/2008 | Broghammer et al. | 388/819 |
| 7,699,687 B2 | 4/2010 | Nordstrom | |
| 2003/0117774 A1 * | 6/2003 | Privett et al. | 361/704 |
| 2004/0112616 A1 * | 6/2004 | Broghammer et al. | 173/217 |
| 2006/0191957 A1 * | 8/2006 | Axinte et al. | 222/146.5 |
| 2009/0239453 A1 * | 9/2009 | Nordstrom | 451/359 |

FOREIGN PATENT DOCUMENTS

CN 201478938 5/2010

* cited by examiner

*Primary Examiner* — Gregory Thompson
(74) *Attorney, Agent, or Firm* — Muncy, Geissler, Olds & Lowe, PLLC

(57) ABSTRACT

A machine tool with a heat conduction structure comprises a machine tool and a heat dissipation seat installed on the machine tool. The machine tool has a handle. The handle has an accommodation space accommodating a circuit board and having an opening at one end. The heat dissipation seat has a heat dissipation member arranged on the opening and a carrying member connected with the heat dissipation member and extended to the accommodation space. The carrying member carries the circuit board, contacts heat sources of the circuit board, and conducts heat to the heat dissipation member. As the machine tool is exempted from forming heat dissipation holes on the handle, the present invention can effectively prevent dust from entering the handle and damaging the circuit board. Further, the present invention can dissipate heat generated by the circuit board and maintain normal operation of the circuit board and the machine tool.

10 Claims, 5 Drawing Sheets

MACHINE TOOL WITH A HEAT CONDUCTION STRUCTURE

FIELD OF THE INVENTION

The present invention relates to a machine tool with a heat conduction structure, particularly to a machine tool with a heat conduction structure conducting heat generated by the machine tool outside.

BACKGROUND OF THE INVENTION

Machine tools are compact and inexpensive, and can be coupled with various application tools, such as grinding discs, emery wheel machines, drilling machines, electric wrenches and the like, to form diversified types to assist operators in performing varying tasks. Therefore, machine tools are very popular.

The conventional machine tool comprises a body, a circuit board arranged inside the body, a motor driven by the circuit board, and a tool shaft rotated by the motor. When the circuit board drives the motor and the tool shaft to rotate, an action element installed on the tool shaft is also driven to operate and machine a workpiece. As the motor of the machine tool is encased in a relatively closed casing, heat generated by the motor is hard to be dissipated. The accumulated heat is likely to overheat the motor and impact the operation of the machine tool. Thus, many heat dissipation structures had been developed to dissipate heat generated by the motor of the machine tool. U.S. Pat. No. 6,789,630 and No. 7,166,939 disclose heat dissipation structures, wherein fan blades or radiation fins are installed on the axis and rotated by the motor to generate airflow to cool the motor. A China patent No. CN201478938 discloses a heat dissipation structure, wherein heat dissipation openings are arranged at a position corresponding to the motor to dissipate heat generated by the motor.

In addition to the motor, control chips and other ICs on the circuit board also generate heat. Thus, the circuit board also needs a heat dissipation mechanism to dissipate heat. A U.S. Pat. No. 7,699,687 discloses a hand-held grinding machine including a housing, a tool shaft arranged inside the housing, a motor installed on the tool shaft, a handle installed on the housing, and a circuit board arranged inside the handle. The handle has a plurality of heat-dissipation holes formed at a position corresponding to the circuit board to dissipate heat generated by the circuit board.

When machining a workpiece, the machine tool usually generates much dust, and the dust is likely to enter the machine tool via the heat dissipation holes and adhere to the circuit board, which may damage the electronic elements on the circuit board and disable the machine tool from operating.

SUMMARY OF THE INVENTION

The present invention is to provide a machine tool with a heat conduction structure, wherein the heat conduction structure not only can dissipate heat generated by the circuit board but also can prevent dust from entering the circuit board, whereby is solved the problems of the conventional technologies.

To achieve the abovementioned objective, the present invention proposes a machine tool with a heat conduction structure, which comprises a machine tool and a heat dissipation seat installed on the machine tool. The machine tool has a handle, and the handle has an accommodation space formed therein. The accommodation space accommodates a circuit board and has an opening on one end. The heat dissipation seat has a heat dissipation member arranged on the opening and a carrying member connected with the heat dissipation member and extended to the accommodation space. The carrying member carries the circuit board and contacts a heat source of the circuit board to conduct heat to the heat dissipation member to dissipate heat. That described above is the main structure of the present invention.

Compared with the conventional technology, the present invention not only can save the time of forming heat dissipation holes on the handle but also can prevent dust from entering the handle and damaging the circuit board in the handle. Further, the present invention can dissipate heat generated by the circuit board and maintain normal operation of the circuit board and the machine tool.

DETAILED DESCRIPTION OF THE PREFERRED EMBODIMENTS

Below, the embodiments are described in detail in cooperation with the drawings to demonstrate the technical contents of the present invention.

Figure 1:
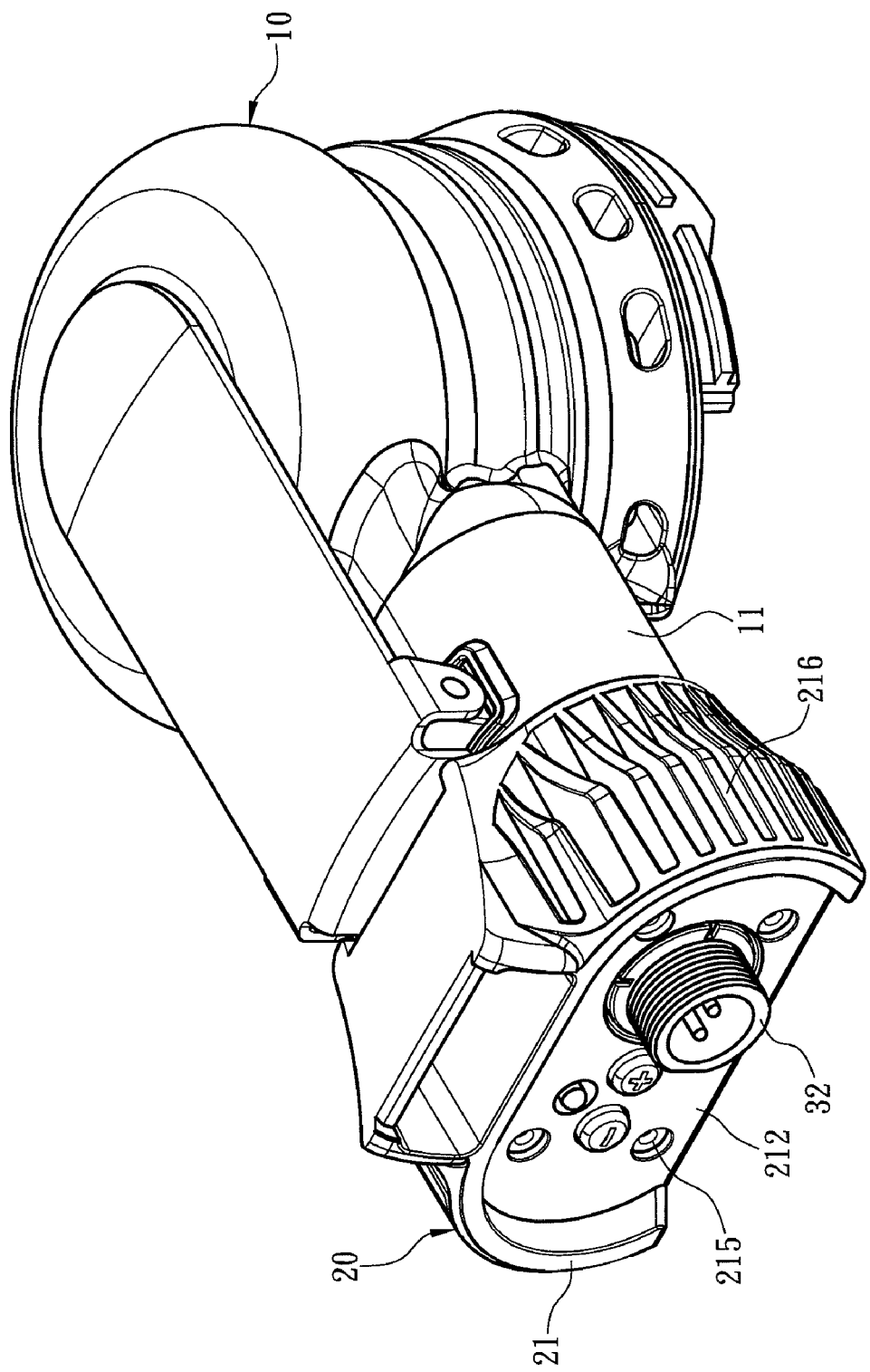
FIG. 1 is a perspective view schematically showing the appearance of a machine tool with a heat conduction structure according to the present invention.
Figure 2:
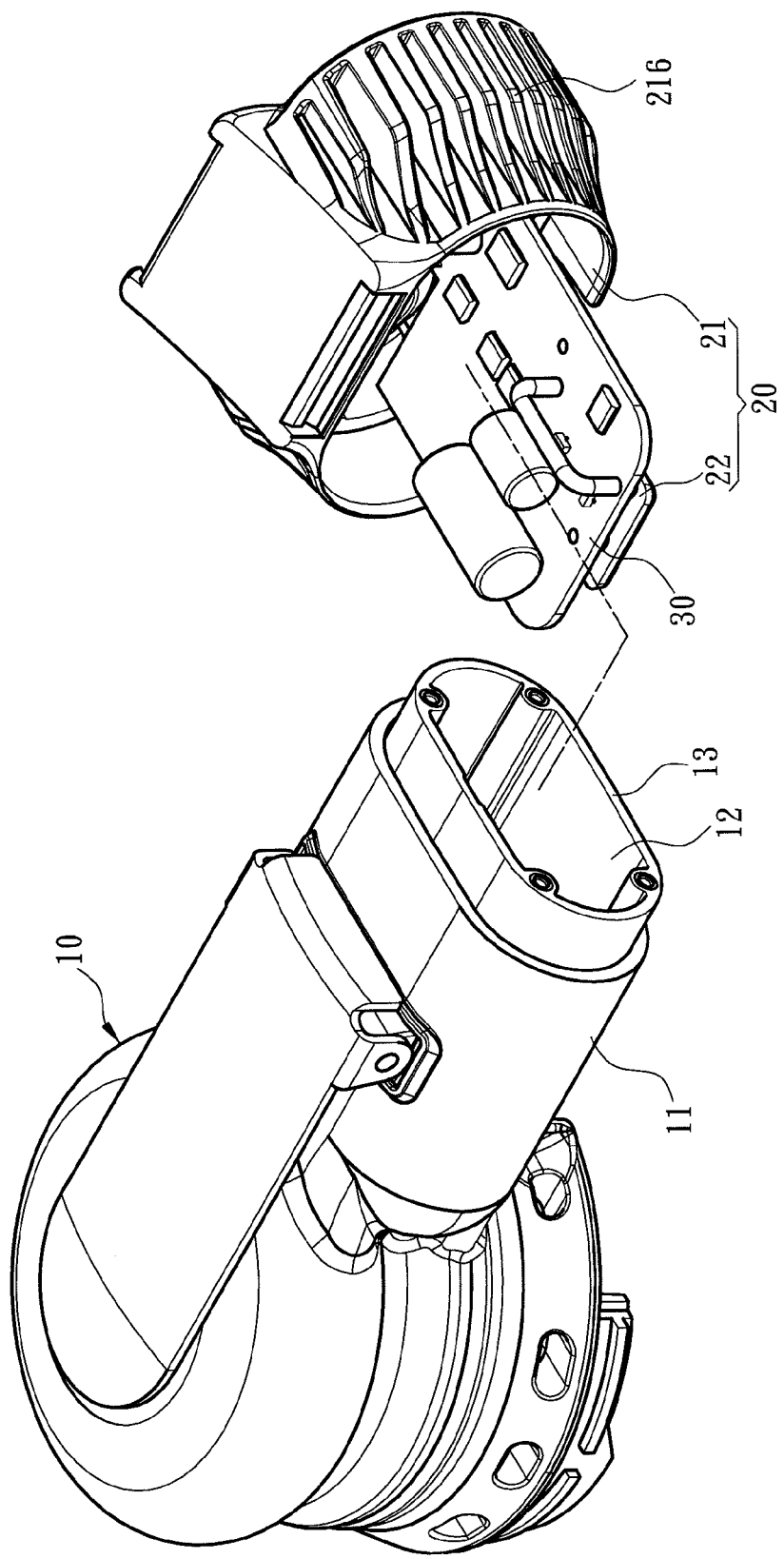
FIG. 2 is an exploded view schematically showing a machine tool with a heat conduction structure according to the present invention.

Refer to FIG. 1 and FIG. 2. The present invention proposes a machine tool with a heat conduction structure, which comprises a machine tool 10 (such as a grinding machine) and a heat dissipation seat 20 installed on the machine tool 10. The machine tool 10 has a handle 11 held by a user. The interior of the handle 11 is hollow and functions as an accommodation space 12. The accommodation space 12 accommodates a circuit board 30 driving the machine tool 10 to operate and control the rotational speed of the machine tool 10. One end of the accommodation space 12 has an opening 13 to hold the heat dissipation seat 20.

Figure 3:
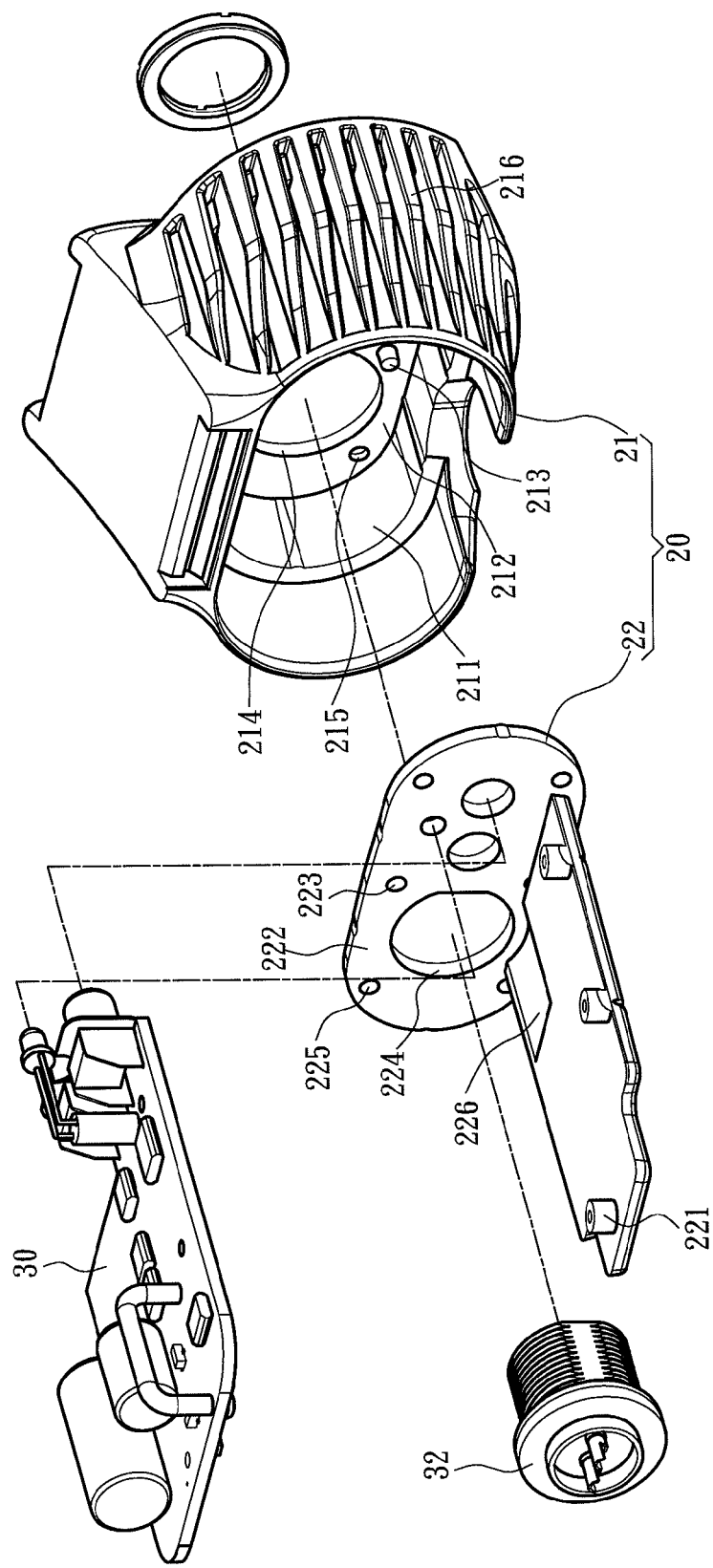
FIG. 3 is an exploded view schematically showing a heat dissipation seat of a machine tool with a heat conduction structure according to the present invention.
Figure 4:
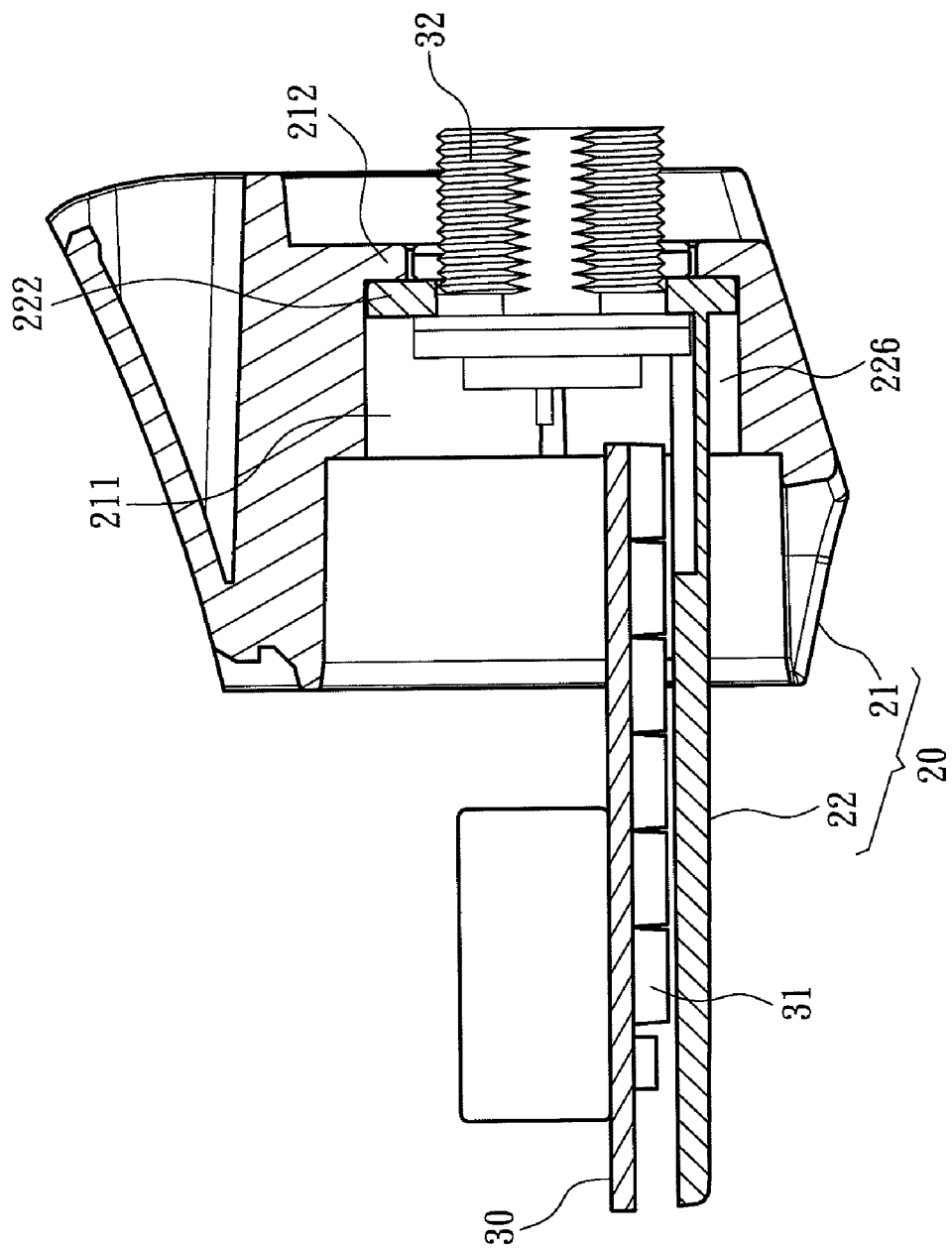
FIG. 4 is a sectional view schematically showing a machine tool with a heat conduction structure according to the present invention.
Figure 5:
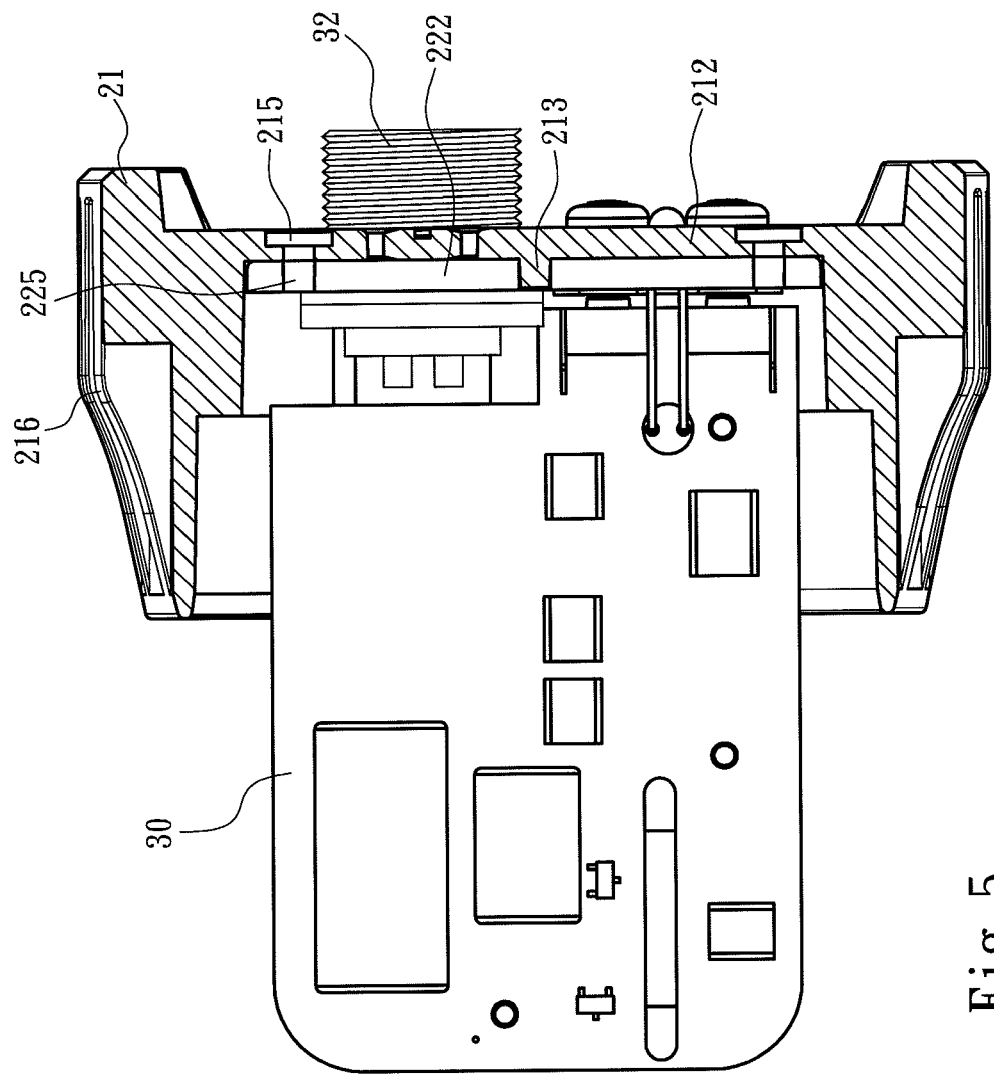
FIG. 5 is another sectional view schematically showing a machine tool with a heat conduction structure according to the present invention.

Refer to FIG. 3. The heat dissipation seat 20 has a heat dissipation member 21 arranged on the opening 13 of the machine tool 10 and a carrying member 22 connected with the heat dissipation seat 20 and extended to the accommodation space 12. The interior of the heat dissipation member 21 functions as an assembly space 211. The heat dissipation member 21 and the carrying member 22 respectively have a first coupling plate 212 and a second coupling plate 222. The second coupling plate 222 of the carrying member 22 is accommodated in the assembly space 211 and coupled with the first coupling plate 212 of the heat dissipation member 21. The first coupling plate 212 has a through-hole 214, and the second coupling plate 222 has a through-hole 224 corresponding to the through-hole 214. A power connector 32 is threaded through the through-holes 214 and 224 to connect with an external power source to drive the circuit board 30 and the machine tool 10. Besides, the carrying member 22 has a recess 226 corresponding to the power connector 32. Refer to FIG. 4 and FIG. 5. The first coupling plate 212 has a first positioning portion 213, and the second coupling plate 222 has a second positioning portion 223 corresponding to the first positioning portion 213 to form positioning relationship. The first positioning portion 213 and the second positioning portion 223 are respectively a strut and an aperture. The first coupling plate 212 has fixing holes 215, and the second coupling plate 222 has fixing holes 225 corresponding to the fixing holes 215. Fastening elements, such as screws, are inserted through the fixing holes 215 and 225. The carrying member 22 has a plurality of supporting portions 221 protruded therefrom to support the circuit board 30. The carrying member 22 contacts heat sources 31 of the circuit board 30, such as the chips and ICs on the circuit board 30. The carrying member 22 conducts heat generated by the heat sources 31 of the circuit board 30 to the heat dissipation member 21 to dissipate heat. In one embodiment, a plurality of radiation fins 216 spaced from each other are arranged on the circumference of the heat dissipation member 21 to increase the heat dissipation area, whereby heat dissipation effect and speed are enhanced.

In conclusion, the present invention uses the heat dissipation seat 20 to seal the circuit board 30 in the handle 11. Further, the carrying member 22 of the heat dissipation seat 20 conducts heat generated by the circuit board 30 to the heat dissipation member 21 arranged outside the handle 11 to dissipate heat. Thereby, the temperature of the circuit board 30 can be effectively reduced to provide normal operation of the circuit board 30 to drive the machine tool without using the conventional heat dissipation holes on the handle 11. Therefore, the present invention can prevent dust from entering the machine tool 10 from the handle 11 and damaging the circuit board 30.

The embodiments described above are only to exemplify the present invention but not to limit the scope of the present invention. Any equivalent modification or variation according to the spirit of the present invention is to be also included within the scope of the present invention.

What is claimed is:

1. A machine tool with a heat conduction structure, comprising:
    a machine tool including a handle, wherein the handle includes an accommodation space formed therein, the accommodation space accommodates a circuit board and includes an opening at one end; and
    a heat dissipation seat including a heat dissipation member arranged on the opening and a carrying member connected with the heat dissipation member and extended to the accommodation space, wherein the carrying member carries the circuit board, contacts a plurality of heat sources of the circuit board and conducts heat generated by the heat sources to the heat dissipation member to dissipate heat.

2. The machine tool with the heat conduction structure according to claim 1, wherein the heat dissipation member includes a plurality of radiation fins spaced from each other arranged on the circumference thereof.

3. The machine tool with the heat conduction structure according to claim 1, wherein the heat dissipation member and the carrying member respectively have a first coupling plate and a second coupling plate.

4. The machine tool with the heat conduction structure according to claim 3, wherein the heat dissipation member includes an assembly space accommodating the second coupling plate.

5. The machine tool with the heat conduction structure according to claim 3, wherein the first coupling plate and the second coupling plate respectively have a through-hole, and the through-holes threaded by a power connector.

6. The machine tool with the heat conduction structure according to claim 5, wherein the carrying member has a recess corresponding to the power connector.

7. The machine tool with the heat conduction structure according to claim 3, wherein the first coupling plate and the second coupling plate respectively have a first positioning portion and a second positioning portion which form positioning relationship.

8. The machine tool with the heat conduction structure according to claim 7, wherein the first positioning portion and the second positioning portion are respectively a strut and an aperture.

9. The machine tool with the heat conduction structure according to claim 3, wherein the first coupling plate and the second coupling plate respectively have fixing holes inserted by fastening elements.

10. The machine tool with the heat conduction structure according to claim 1, wherein the carrying member has a plurality of supporting portions protruded therefrom to support the circuit board.

* * * * *